United States Patent [19]
Larkin

[11] Patent Number: 5,922,619
[45] Date of Patent: Jul. 13, 1999

[54] PATTERNLESS TECHNIQUE FOR BUILDING SELF-ALIGNED FLOATING GATES

[75] Inventor: David L. Larkin, Lubbock, Tex.

[73] Assignee: Texas Instruments Incorporated, Dallas, Tex.

[21] Appl. No.: 08/942,503

[22] Filed: Oct. 2, 1997

Related U.S. Application Data

[60] Provisional application No. 60/030,427, Oct. 29, 1996.

[51] Int. Cl.⁶ .................................................. H01L 20/21
[52] U.S. Cl. ......................... 438/692; 438/257; 438/262; 438/710
[58] Field of Search ................................. 438/593, 257, 438/262, 691, 692, 737

[56] References Cited

U.S. PATENT DOCUMENTS

| | | | |
|---|---|---|---|
| 4,317,272 | 3/1981 | Kuo | 438/593 |
| 4,373,248 | 2/1983 | McElroy | 438/262 |
| 4,683,640 | 8/1987 | Faraone | 438/593 |
| 4,688,720 | 8/1987 | Hayashi | 438/692 |
| 5,570,314 | 10/1996 | Gill | 438/593 |

*Primary Examiner*—Benjamin Utech
*Assistant Examiner*—DuyVu Deo
*Attorney, Agent, or Firm*—Robby T. Holland; Carlton H. Hoel; Richard L. Donaldson

[57] ABSTRACT

A patternless, self-aligning method of forming a floating gate on a silicon wafer having a plurality of raised field oxide isolation structures. The method of the present invention includes depositing a polysilicon layer onto the silicon wafer and the raised field oxide isolation structures, depositing a polysilicon etch masking layer onto the polysilicon layer, and planarizing the polysilicon etch masking layer. The polysilicon etch masking layer is then etched to expose the polysilicon layer over the raised field oxide isolation structures. The exposed polysilicon layer is then etched to remove the polysilicon layer over the raised field oxide isolation structures. The remaining polysilicon etch masking layer is then removed, leaving a plurality of polysilicon regions covering the silicon wafer between the field oxide isolation structures.

18 Claims, 1 Drawing Sheet

PATTERNLESS TECHNIQUE FOR BUILDING SELF-ALIGNED FLOATING GATES

This application claims priority under 35 USC §119(e)(1) of provisional application number 60/030,427, filed Oct. 29, 1996.

TECHNICAL FIELD OF THE INVENTION

The present invention relates generally to fabrication of semiconductor devices, and more particularly, to a patternless method for fabricating self-aligned floating gate regions on a silicon wafer.

BACKGROUND OF THE INVENTION

The fabrication of semiconductor devices including floating gate arrays involves many complex steps. These steps can include a Poly 1 Array step that involves depositing a nitride layer over the silicon wafer, patterning the nitride layer with a photolithographic process, and etching the nitride layer. The silicon wafer can then be placed into a furnace where a plurality of field oxide isolation structures (i.e., thick field regions) are grown on the silicon wafer. The formation of the field oxide isolation structures in this manner results in a field oxide isolation structures that extend above the plane of the silicon wafer. A layer of polysilicon is then deposited over the silicon wafer and the multiple thick field oxide regions.

In completing the Poly 1 Array step, conventional manufacturing methods include a pattern level step that involves putting down a layer of photoresist on the polysilicon and exposing a reticle onto the photoresist to define a pattern. The reticle can consist of a pattern of chrome and glass, that when projected onto the photoresist, defines what areas of the photoresist will be exposed to light. A stepper then exposes the photoresist while the reticle acts as a mask, resulting in a pattern on the silicon wafer. The pattern will leave photoresist over the polysilicon in the channel areas between the field oxide isolation structures and will remove the photoresist over the polysilicon on the raised portions of the field oxide isolation structures.

In order to create the proper pattern on the wafer, the reticle must be properly aligned. To align the reticle, alignment marks can be placed at predetermined locations on a variety of previous pattern levels. The stepper can read the alignment marks and use them to properly align the reticle with the wafer. The reticle is then exposed and the pattern is formed.

A polysilicon etch is then applied that will remove the polysilicon layer not covered by photoresist, but will not remove the photoresist (and thus, will not remove the polysilicon covered by the photoresist). A photoresist etch is then applied to remove the remaining photoresist. The finished product resulting from this Poly 1 Array process consists of a silicon wafer with raised field oxide isolation structures where the tops of the field oxide isolation structures are exposed and the channels between the field oxide isolation structures are covered by a plurality of polysilicon layers. These polysilicon layers between the thick field regions provide the structure used to manufacture floating gate arrays on the silicon wafer.

This conventional method for forming floating gate array regions (the Poly 1 Array step) including a pattern level step can increase manufacturing delays and costs. The pattern level step requires the use of stepper machines that are expensive and typically exist in limited numbers. The pattern level step also requires an alignment procedure to align the reticle on the silicon wafer. This alignment procedure has inherent inaccuracies. Both the pattern level and the alignment procedures represent additional manufacturing steps when forming floating gate array regions in the wafer.

This conventional method of creating floating gate regions on a silicon wafer can also experience uniformity problems across the die during manufacture due to variations in light effects and chemical etch composition at the edge of a wafer. Furthermore, conventional methods can also produce post-etch filaments that can cross between field oxide isolation structures and cause shorts between devices.

SUMMARY OF THE INVENTION

The present invention provides a patternless method for building floating gate regions on silicon wafers that substantially eliminates or reduces disadvantages and problems associated with previously developed methods for building floating gate regions.

More specifically, the present invention provides a patternless, self-aligning method of forming a floating gate on a silicon wafer having a plurality of raised field oxide isolation structures. The method of the present invention includes depositing a polysilicon layer onto the silicon wafer and the raised field oxide isolation structures, depositing a polysilicon etch masking layer onto the polysilicon layer, and planarizing the polysilicon etch masking layer. The polysilicon etch masking layer is then etched to expose only the polysilicon layer over the raised field oxide isolation structures. The exposed polysilicon layer is then etched to remove the polysilicon layer over the raised field oxide isolation structures. The remaining polysilicon etch masking layer is then removed, leaving a plurality of polysilicon regions covering the silicon wafer between the field oxide isolation structures.

The present invention provides an important technical advantage by removing the pattern level manufacturing step. The present invention uses the silicon wafer topography and a planarized etch masking layer to eliminate the pattern level and enable self-alignment of the slots for the floating gates. This reduces the cost of manufacturing semiconductor devices using floating gates, eliminates a stepper capacity problem, and eliminates the need for an alignment step.

The present invention provides another technical advantage by increasing uniformity of the silicon wafer across the die. The method of the present invention provides yet another technical advantage by eliminating post-etch filaments that can lead to shorts across devices.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGURES, like numerals being used to refer to like and corresponding parts of the various drawings.

The present invention uses a planarized polysilicon etch masking layer and several etching steps, in conjunction with the topography of the field oxide isolation structures in a silicon wafer to create the polysilicon regions used as floating gates in a silicon based semiconductor device.

Figure 1:
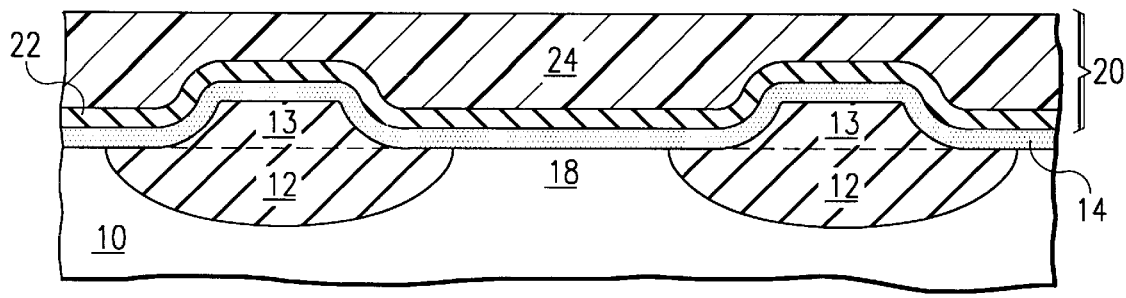
FIG. 1 is a cross sectional view of a silicon wafer with raised field oxide isolation structures covered by a layer of polysilicon, and including one embodiment of the planarized polysilicon etch masking layer according to the teachings of the present invention.

FIG. 1 is a cross-sectional view of a silicon wafer 10 that includes a plurality of field oxide isolation structures 12 grown onto the silicon wafer 10. As shown in FIG. 1, a portion 13 of each field oxide isolation structure 12 extends above the top plane of the silicon wafer as viewed from the side cross section. These raised field oxide isolation structures 12 can be produced by depositing a nitride layer onto the silicon wafer 10, depositing a photoresist onto the nitride layer, patterning the photoresist using a reticle, etching the nitride layer, placing the silicon wafer having the patterned nitride layer in a furnace, and growing a plurality of field oxide structures 12 in the patterned areas.

In the process of growing the field oxide isolation structures 12 down into the silicon 10, the field oxide isolation structures 12 also grow up above the plane of the top surface of the silicon wafer 10. The resulting topography having field oxide isolation structures 12 with raised portions 13 that extend above the horizontal surface plane of the silicon wafer (as illustrate in FIG. 1) must exist for successful implementation of the present invention. While the height the field oxide isolation structures 12 extend beyond the silicon wafer 10 is not critical, these thick field regions 12 must extend above the silicon wafer top surface.

A layer of polysilicon 14 is deposited onto the silicon wafer 10 and the field oxide isolation structures 12. As shown in FIG. 1, the polysilicon layer 14 covers the silicon channel 18 between the field oxide isolation structures 12, as well as the raised portions 13 of the field oxide isolation structures 12. The thickness of the polysilicon layer 14 can be any thickness that allows the building of floating gates on the silicon wafer 10.

The next step involves depositing a polysilicon etch masking layer 20 over the polysilicon layer 14 and planarizing the polysilicon etch masking layer 20, as shown in FIG. 1. The planarization of the polysilicon etch masking layer 20 allows uniform removal of the deposited layers in later steps. FIG. 1 shows one embodiment of the polysilicon etch masking layer 20 that comprises a TEOS oxide layer 22 deposited over the polysilicon layer 14 and a boron phosphate silicate glass (BPSG) layer 24 deposited over the TEOS oxide layer 22. The BPSG layer 24 is then planarized. When using BPSG in the outermost layer of the polysilicon etch masking layer 20, the planarization can be accomplished by re-flowing the BPSG layer 24 after deposition onto the TEOS oxide layer 22. Alternatively, the planarization of the BPSG layer 24 can be accomplished by performing a chemical mechanical polishing on the BPSG, by precision deposition of the BPSG onto the TEOS oxide layer 22, or by any other method that will effectively planarize the BPSG layer 24. In the context of the present invention, planarization refers to making the top surface of the polysilicon etch masking layer 20 approximately parallel to the horizontal plane of the silicon wafer 10.

In the embodiment shown in FIG. 1, the TEOS oxide layer 22 can have a thickness of approximately 1000 angstroms while the BPSG layer 24 can have a thickness of approximately 5000 angstroms. These thicknesses are merely illustrative and other thicknesses of the TEOS oxide and BPSG could be used. When using BPSG as in the layer to be planarized, the height of the BPSG above the layer below the BPSG should be sufficient to allow re-flowing of the BPSG when planarizing the BPSG using a re-flowing technique. The optimal thickness of the polysilicon etch masking layer 20 will occur at or near the smallest thickness that will allow planarization without affecting the layer below the polysilicon masking layer 20. The thicker the polysilicon masking layer 20, the greater the likelihood that variations (nonuniformities) over the entire wafer might be introduced during the later etch stages.

In an alternative embodiment, any suitable oxide (i.e., silicon dioxide), for example the TEOS oxide, could be deposited as a single layer over the polysilicon layer 14 such that the entire polysilicon etch masking layer 20 comprises a single oxide. The oxide layer could then be planarized by performing a chemical mechanical polishing (thereby forming a planarized polysilicon etch masking layer 20). In another example, the single oxide layer could be formed by pouring HSQ liquid (or any other spin on glass (SOG) precursor) onto the polysilicon layer 14 and curing the HSQ to form an oxide on top of the polysilicon layer 14.

Polysilicon etch masking layers 20 other than oxides could also be used in conjunction with the present invention. For example, photoresist could be substituted for the BPSG in the BPSG layer 24 of FIG. 1. The photoresist in layer 24 would then be planarized using a suitable method (for example, through proper control of the spin speed and resist flow). In an alternative embodiment, the polysilicon etch masking layer 20 could comprise silicon nitride, planarized using a chemical mechanical process, as the polysilicon etch mask.

As illustrated, the present invention can use a variety of substances in the polysilicon etch masking layer 20, a variety of thicknesses of the polysilicon etch masking layer 20, and a number of techniques to planarize the polysilicon etch masking layer 20. The present invention merely requires the polysilicon etch masking layer 20 (i) comprise a material that can be etched by a substance that will not etch the polysilicon of polysilicon layer 14 and (ii) can be planarized to allow uniform etching of the polysilicon etch masking layer 20. This planarized polysilicon etch masking layer 20 must be deposited over a polysilicon layer 14 (or other suitable material) that has been deposited onto a silicon wafer 10 having raised field oxide isolation structures 12 in order to implement the present invention. FIG. 1 shows one embodiment of this type of structure.

Figure 2:
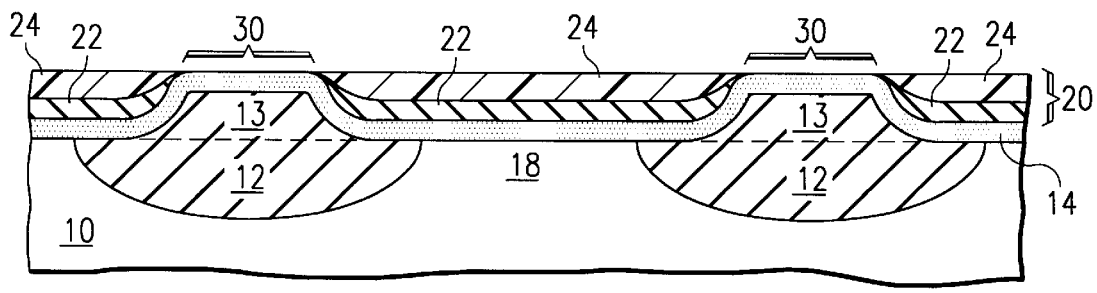
FIG. 2 is a cross sectional view of the structure of FIG. 1 after a masking etch has been performed.

The polysilicon etch masking layer 20 is then etched until the portion of the polysilicon layer 14 over the raised field oxide isolation structures 12 is exposed. FIG. 2 shows the embodiment of FIG. 1 after this polysilicon etch masking layer etch step has been performed to leave the exposed polysilicon portions 30. In the embodiment of FIG. 1 (and all embodiments using a polysilicon etch masking layer 20 comprising oxide), an oxide etch can be used to remove the BPSG layer 24 and TEOS oxide layer 22 until the polysilicon portions 30 above the field isolation structures 12 are exposed. As shown in FIG. 2, the resulting structure has polysilicon etch masking layer 20, comprising TEOS oxide layer 22 and BPSG layer 24, covering the polysilicon layer 14 in the channel area 18 (i.e., the portions of the polysilicon layer 14 not on top of the thick field oxide regions 12). A variety of methods can be employed to ensure the oxide etch is performed for a period long enough to expose the polysilicon portions 30 adjacent the raised portions 13 of the field oxide isolation structures 12, including timing the etch period and end point detection. To time the etch period, the thickness of the oxide can be measured, the etch rate of the etcher can be determined, and the etcher can operate to etch the polysilicon etch masking layer 20 for an appropriate amount of time to expose the polysilicon portions 30 above the thick field oxide regions 12. The end point detection method involves measuring the signal strength of certain chemicals released during the oxide etch. When the signal strength drops to a certain level, this signals that the amount of oxide being etched has decreased because the polysilicon portions 30 over the field oxide isolation structures 12 have been exposed. As shown in FIG. 2, the polysilicon etch masking layer etch step can result in a structure that is also planarized across the top due to the uniformity of the etch.

The oxide etch process shown in FIG. 2 can be performed by flowing appropriate chemicals through a gas showerhead in an etch chamber. The chemicals can be excited by an RF (or other appropriate) source to selectively etch the oxide upon contact. The gas showerhead can be designed to provide an approximately even flow of the gas and RF energy across the wafer.

In the FIG. 1 embodiment, the TEOS oxide layer 22 was deposited over the polysilicon layer 14 prior to depositing the BPSG layer 24 (rather than simply depositing a single layer of BPSG) to enhance the oxide etch step shown in FIG. 2. Depositing a layer of TEOS oxide on the polysilicon layer prior to depositing and planarizing the BPSG enhances the oxide etch because the selectivity (i.e., the rate of etch of silicon as compared to the rate of etch of the oxide) of the TEOS oxide is better than the selectivity of the BPSG. This improved selectivity enhances the ability to expose the polysilicon above the field oxide isolation structures will maintaining a planarized top layer.

In alternative embodiments that do not use an oxide for the polysilicon etch masking layer 20, different etch chemicals and processes may need to be used. For example, a nitride etch could be used to etch a polysilicon etch masking layer 20 comprised of silicon nitride.

Figure 3:
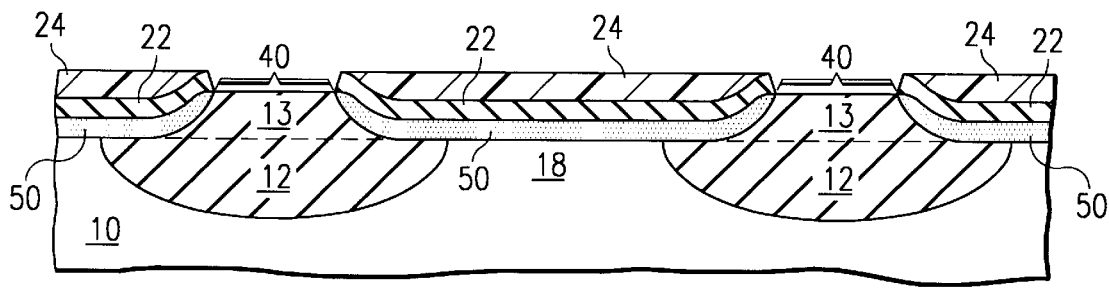
FIG. 3 is a cross sectional view of the structure of FIG. 2 after a polysilicon etch step has been performed.

The exposed polysilicon portions 30 can then be etched using a polysilicon etch until the raised portions 13 of the field oxide isolation structures 12 are exposed to create a plurality of slots 40 and a plurality of polysilicon regions 50 between the slots 40. FIG. 3 shows the embodiment of FIG. 2 after this polysilicon etch step has removed the exposed polysilicon portions 30. As shown in FIG. 3, the resulting structure has exposed the raised portions 13 of the field oxide isolation structures 12 to create a plurality of slots 40, while the areas between the raised portions 13 of the field oxide isolation structures 12 now consists of a plurality of polysilicon regions 50. Each polysilicon region 50 is covered by polysilicon etch masking layer 20 (consisting of a TEOS oxide layer 22 covered by a BPSG layer 24 in the embodiment of FIG. 3). A polysilicon etch can be used to remove the exposed polysilicon portions 30 without removing the polysilicon etch masking layer 20 over each of the polysilicon regions 50. This polysilicon etch can be performed similarly to the oxide etch described above, but varying the chemicals deposited to those that etch polysilicon without etching oxide. The polysilicon etch process typically etches away the polysilicon at an angle perpendicular to the planarized upper surface. In other words, the polysilicon etch generally etches straight down and does not etch to the side.

Figure 4:
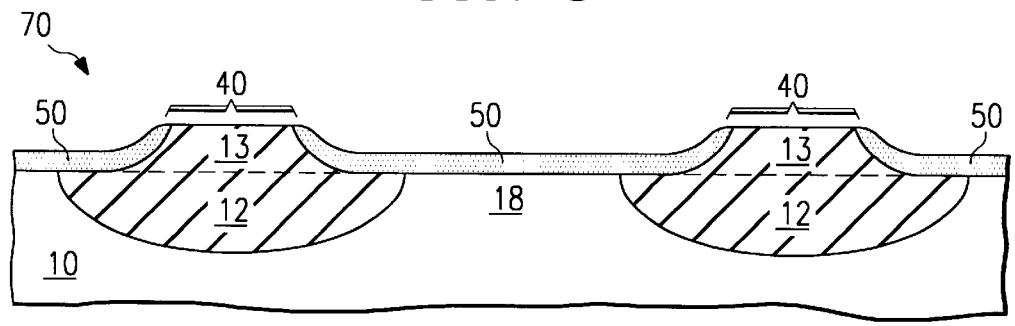
FIG. 4 is a cross sectional view of the structure of FIG. 3 after removal of the remaining polysilicon etch masking.

The last step involves removing the polysilicon etch masking layer 24 that remains over the plurality of polysilicon regions 50 of FIG. 3. In this step, a final oxide etch can remove the polysilicon etch masking layer 24 that remains over the polysilicon regions 50. Again, this oxide etch can be performed using a gas showerhead etcher as described previously. FIG. 4 shows the resulting structure 70 after the process of the present invention has been performed.

The resulting structure 70 includes a plurality of polysilicon regions 50 separated by slots 40 located above each of the raised portions 13 of the field oxide isolation structures 12. These polysilicon regions 50 provide the basic building blocks to form floating gates on the silicon wafer 10. Specifically, these polysilicon layers 50 can serve as the starting points for building a floating gate array (or FAMOS cells) for non-volatile (NOVO) memory devices. The remainder of the device can then be built on top of the structure 70.

The planarized polysilicon etch masking layer 20 combined with the topography of the raised oxide field isolation structures 12 and selective material etching allows these slotted polysilicon regions 50 to be built onto a silicon wafer without using a pattern level. The patternless technique of the present invention can save time and reduce cost by removing the pattern level step.

This patternless technique also eliminates the need to align the reticle on the silicon wafer. The topography and planarization of the present invention allows etching the polysilicon on top of the raised portions 13 of the field oxide isolation structures 12. This results in an automatic alignment of the plurality of polysilicon regions 50 on the silicon wafer 10 between the field oxide isolation structures 12.

This patternless technique can also increase the uniformity of the slots 40 and polysilicon regions 50 across the die of the silicon wafer 10 if uniform etch processes are used in conjunction with the planarized polysilicon etch masking layer 20. The elimination of the pattern level step eliminates the non-uniformity at the edge of the array on the silicon wafer caused by diffraction effects and chemical variation. This potentially allows the use of a greater portion of the silicon wafer 10.

The patternless technique of the present invention is also scalable such that if the devices are made smaller, the process described by the present invention remains the same. Thus, the field oxide isolation structures 12 can be grown closer together or farther apart, smaller or larger in size, or with a greater or lesser height in the raised portions 13 without affecting the methodology used in the present invention.

The patternless technique of the present invention also eliminates post-etch polysilicon filaments that can form if the polysilicon is not completely etched. These post-etch filaments can potentially lay between and short out devices. The present invention eliminates these post-etch filaments because the polysilicon etch is performed for a period long enough to completely etch the polysilicon above the raised portions 13 of the field oxide isolation structures 12.

In summary, the present invention provides a patternless, self-aligning method of forming a floating gate on a silicon wafer having a plurality of raised field oxide isolation structures. The method of the present invention includes depositing a polysilicon layer onto the silicon wafer and the raised field oxide isolation structures, depositing a polysilicon etch masking layer onto the polysilicon layer, and planarizing the polysilicon etch masking layer. The polysilicon etch masking layer is then etched to expose the polysilicon layer over the raised field oxide isolation structures. The exposed polysilicon layer is then etched to remove the polysilicon layer over the raised field oxide isolation structures. The remaining polysilicon etch masking layer is then removed, leaving a plurality of polysilicon regions between the field oxide isolation structures. The present invention removes a pattern level, increases uniformity across the die, and provides a self-aligning technique for building floating gates.

Although the present invention has been described in detail, it should be understood that various changes, substitutions and alterations can be made hereto without departing from the spirit and scope of the invention as described by the appended claims.

What is claimed is:

1. A patternless, self-aligning method of forming a floating gate on a silicon wafer having a plurality of raised field oxide isolation structures, comprising:

depositing a polysilicon layer onto the silicon wafer and the raised field oxide isolation structures;

depositing a polysilicon etch masking layer onto the polysilicon layer;

planarizing the polysilicon etch masking layer;

etching the polysilicon etch masking layer to expose the portion of the polysilicon layer over the raised portions of the field oxide isolation structures;

etching the exposed polysilicon portions to remove the exposed polysilicon portions over the raised portions of the field oxide isolation structures; and removing the remaining polysilicon etch masking layer.

2. The method of claim 1, wherein depositing a polysilicon etch masking layer further comprises depositing a layer comprising a material that can be etched by a substance that will not etch polysilicon and can be planarized.

3. The method of claim 1, wherein depositing a polysilicon etch masking layer further comprises depositing an oxide layer onto the polysilicon layer.

4. The method of claim 1, wherein depositing a polysilicon etch masking layer onto the polysilicon layer further comprises;

depositing an approximately 1000 angstrom thick layer of TEOS oxide layer onto the polysilicon layer; and depositing an approximately 5000 angstrom thick layer of photoresist onto the TEOS oxide layer.

5. The method of claim 1, wherein depositing a polysilicon etch masking layer onto the polysilicon layer further comprises depositing a TEOS oxide layer onto the polysilicon layer and depositing a boron phosphorous silicon glass layer over the TEOS oxide layer, and further wherein planarizing the polysilicon etch masking layer further comprises reflowing the boron phosphorous silicon glass layer, and further wherein etching the polysilicon etch masking layer further comprises performing an oxide etch.

6. The method of claim 1, wherein depositing a polysilicon etch masking layer onto the polysilicon layer further comprises depositing a silicon nitride layer onto the polysilicon layer, and further wherein planarizing the polysilicon etch masking layer further comprises performing a chemical mechanical polishing process on the silicon nitride layer, and further wherein etching the polysilicon etch masking layer further comprises performing a silicon nitride etch.

7. The method of claim 1, wherein depositing a polysilicon etch masking layer onto the polysilicon layer further comprises depositing a spin-on-glass precursor onto the polysilicon layer, and further wherein planarizing the polysilicon etch masking layer further comprises performing a chemical mechanical polishing process on the spin-on-glass precursor layer, and further wherein etching the polysilicon etch masking layer further comprises performing an oxide etch.

8. The method of claim 1 further comprising, determining the etch rate of the polysilicon etch masking layer;

determining the thickness of the polysilicon etch masking layer;

determining an amount of time required to etch the polysilicon etch masking layer in order to expose the portion of the polysilicon layer above the raised portions of the field oxide isolation structures; and etching the polysilicon etch masking for the determined amount of time.

9. The method of claim 1, wherein etching the polysilicon etch masking layer further comprises exposing the polysilicon etch masking layer to a chemical that will etch the polysilicon etch masking layer without etching the polysilicon layer.

10. The method of claim 1, wherein removing the remaining polysilicon etch masking further comprises etching the polysilicon etch masking by exposing the polysilicon etch masking layer to a chemical that will etch the polysilicon etch masking layer without etching polysilicon.

11. A patternless, self-aligning method of forming a plurality of polysilicon regions used to form floating gates on a silicon wafer, comprising:

depositing a nitride layer onto the silicon wafer;

masking the nitride layer;

etching the nitride layer not covered by the mask;

removing the mask;

placing the silicon wafer into a furnace;

growing a plurality of field oxide isolation structures on the silicon wafer such that the field oxide isolation structures are raised above the silicon wafer;

depositing a polysilicon layer onto the silicon wafer and the raised field oxide isolation structures;

depositing a polysilicon etch masking layer onto the polysilicon layer;

planarizing the polysilicon etch masking layer;

etching the polysilicon etch masking layer to expose the portion of the polysilicon layer over each of the raised portions of the field oxide isolation structures;

etching the exposed polysilicon layer to form a slot in the polysilicon layer over each of the raised portions of the field oxide isolation structures; and removing the remaining polysilicon etch masking layer.

12. The method of claim 11, wherein masking the nitride layer further comprises patterning the nitride layer using photoresist and a reticle placed onto the nitride layer.

13. The method of claim 11, wherein depositing a polysilicon etch masking layer further comprises depositing a layer comprising a material that can be etched by a substance that will not etch polysilicon and can be planarized.

14. The method of claim 11, wherein etching the polysilicon etch masking layer further comprises exposing the polysilicon etch masking layer to a chemical that will etch the polysilicon etch masking layer without etching the polysilicon layer.

15. The method of claim 11, wherein depositing a polysilicon etch masking layer further comprises depositing an oxide layer onto the polysilicon layer.

16. The method of claim 11, wherein the method further comprises;

determining the etch rate of the polysilicon etch masking layer;

determining the thickness of the polysilicon etch masking layer;

determining an amount of time required to etch the polysilicon etch masking layer in order to expose the portion of the polysilicon layer above the raised portions of the field oxide isolation structures; and etching the polysilicon etch masking for the determined amount of time.

17. The method of claim 11, wherein etching the exposed polysilicon layer to form a slot in the polysilicon layer over each of the raised portions of the field oxide isolation structures forms a plurality polysilicon regions used to build floating gates for semiconductor devices.

18. A patternless, self-aligning method of forming a plurality of polysilicon regions on a silicon wafer having a plurality of field oxide isolation structures, each field oxide isolation structure having a raised portion, comprising:

depositing a polysilicon layer onto the silicon wafer and the raised field oxide isolation structures;

depositing a TEOS oxide layer onto the polysilicon layer;

depositing a boron phosphorous silicon glass layer over the TEOS oxide layer;

planarizing the boron phosphorous silicon glass layer;

etching the boron phosphorous silicon glass layer and the TEOS oxide layer using an oxide etch, to expose the portion of the polysilicon layer over each of the raised portions of the field oxide isolation structures;

etching the exposed polysilicon layer to expose the raised portions of the field oxide isolation structures to form a plurality polysilicon regions; and removing the remaining boron phosphorous silicon glass layer and the remaining TEOS oxide layer to form a structure having the plurality of polysilicon regions separated by the plurality of field oxide isolation structures on a silicon wafer for building a plurality of floating gates.

* * * * *